United States Patent [19]

Burrows

[11] Patent Number: 5,053,991

[45] Date of Patent: Oct. 1, 1991

[54] CONTENT-ADDRESSABLE MEMORY WITH SOFT-MATCH CAPABILITY

[75] Inventor: James L. Burrows, Merrimack, N.H.

[73] Assignee: Sanders Associates, Inc., Nashua, N.H.

[21] Appl. No.: 418,300

[22] Filed: Oct. 6, 1989

[51] Int. Cl.$^5$ ............................................. G11C 15/00
[52] U.S. Cl. ...................................... 365/49; 364/200; 364/253.1; 364/259.2
[58] Field of Search ................................ 365/49; 364/900 MS File, 200 MS File

[56] References Cited

U.S. PATENT DOCUMENTS

| | | | |
|---|---|---|---|
| 3,372,381 | 5/1968 | Raspanti | 364/200 |
| 3,430,203 | 2/1969 | Crawford | 364/900 |
| 3,435,422 | 3/1969 | Gerhardt et al. | 364/900 |
| 3,533,072 | 10/1967 | Clapper | 364/900 |
| 3,535,693 | 10/1970 | Connelly | 364/900 |
| 3,596,258 | 7/1971 | Choate et al. | 364/900 |
| 3,613,084 | 10/1971 | Armstrong | 364/900 |
| 3,700,865 | 10/1972 | Taylor | 364/900 |
| 3,716,840 | 2/1973 | Masten et al. | 364/200 |
| 3,725,875 | 4/1973 | Choate et al. | 364/200 |
| 3,868,655 | 2/1975 | Filippazzi | 365/49 |
| 3,878,542 | 4/1975 | Myer | 365/2 |
| 3,934,231 | 1/1976 | Armstrong | 364/900 |
| 3,949,368 | 4/1976 | West | 364/200 |
| 3,949,369 | 4/1976 | Churchill, Jr. | 364/200 |
| 3,969,707 | 7/1976 | Lane et al. | 365/49 |
| 4,010,452 | 3/1977 | Cazanove | 364/200 |
| 4,056,845 | 11/1977 | Churchill, Jr. | 364/200 |
| 4,062,001 | 12/1977 | Baker | 365/49 |
| 4,068,305 | 1/1978 | Cutler | 364/200 |
| 4,075,689 | 2/1978 | Berkling | 364/200 |
| 4,084,235 | 4/1978 | Hirtle et al. | 364/200 |
| 4,084,260 | 4/1978 | Fleming et al. | 364/900 |
| 4,164,025 | 3/1979 | Dubnowski et al. | 364/900 |
| 4,254,476 | 3/1981 | Burrows | 365/49 |
| 4,296,475 | 10/1981 | Nederlof et al. | 364/900 |
| 4,327,407 | 4/1982 | Burrows | 364/200 |
| 4,342,093 | 7/1982 | Miyoshi | 364/578 |
| 4,366,551 | 12/1982 | Holtz | 364/900 |
| 4,374,412 | 2/1983 | Schaffner | 364/200 |
| 4,377,855 | 3/1983 | Lavi | 365/49 |
| 4,385,371 | 5/1983 | Shafer et al. | 365/49 |
| 4,456,976 | 6/1984 | Savage | 365/49 |
| 4,458,310 | 7/1984 | Chang | 364/200 |
| 4,464,732 | 8/1984 | Clark | 364/900 |
| 4,475,194 | 10/1984 | LaVallee et al. | 371/10.2 |
| 4,484,266 | 11/1984 | Becker et al. | 364/200 |
| 4,494,191 | 1/1985 | Itoh | 364/200 |

(List continued on next page.)

OTHER PUBLICATIONS

Wade, J. P. and C. G. Sodini, "Dynamic Cross-Coupled Bitline Content Addressable Memory Cell for High Density Arrays", *IEEE International Electron Devices Meeting,* 1985.

Primary Examiner—Joseph A. Popek
Attorney, Agent, or Firm—Cesari and McKenna

[57] ABSTRACT

Each word location (18-0, 18-1, 18-255) in a content-addressable memory has a tally circuit (24-0, 24-1, 24-255) associated with it. A data word on data lines (12) is compared simultaneously with the words in all of the word locations, and the tally circuit associated with each location counts the number of matches between the key word in that location and the data word represented by the signals on the data line. The tally circuits apply tally signals representing the number of matching bits in their respective word locations to comparison circuits (28-1, 28-255), each of which compares the tally output from its associated tally circuit with the output from a previous comparison circuit and forwards the higher of the two to the next comparison circuit. Each comparison circuit also applies to a priority encoder (32) an output that indicates whether the associated tally circuit has generated a tally signal representing a tally greater than that from all previious locations. The encoder circuit (32) encodes the address of the location having the highest tally, and the output of the last comparison represents the highest tally is. In this manner, the content-addressable memory (10) can be addressed by the closest match, not only by an exact match.

8 Claims, 4 Drawing Sheets

U.S. PATENT DOCUMENTS

| | | | |
|---|---|---|---|
| 4,504,907 | 3/1985 | Manning et al. | 364/200 |
| 4,507,748 | 3/1985 | Cotton | 364/749 |
| 4,513,374 | 4/1985 | Hooks, Jr. | 364/200 |
| 4,523,301 | 6/1985 | Kadota et al. | 365/49 |
| 4,527,249 | 7/1985 | Van Brunt | 364/578 |
| 4,532,606 | 7/1985 | Phelps | 365/49 |
| 4,538,243 | 8/1985 | Zehner | 365/49 |
| 4,546,428 | 10/1985 | Morton | 364/200 |
| 4,559,618 | 12/1985 | Houseman et al. | 365/49 |
| 4,575,798 | 3/1986 | Lindstrom et al. | 364/300 |
| 4,580,215 | 4/1986 | Morton | 364/200 |
| 4,583,169 | 4/1986 | Cooledge | 364/300 |
| 4,622,653 | 11/1986 | McElroy | 365/49 |
| 4,627,024 | 12/1986 | Whalen et al. | 364/900 |
| 4,630,234 | 12/1986 | Holly | 364/900 |
| 4,660,166 | 4/1987 | Hopfield | 364/807 |
| 4,670,858 | 6/1987 | Almy | 365/49 |
| 4,755,974 | 7/1988 | Yamada et al. | 365/49 |
| 4,897,814 | 1/1990 | Clark | 365/49 |

| BITS/WORD | S1 | S0 | \multicolumn{15}{c}{PG INPUTS} | | | | | | | | | | | | | | | $I_3$ | $I_2$ | $I_1$ | $I_0$ |
|---|---|---|---|---|---|---|---|---|---|---|---|---|---|---|---|---|---|---|---|---|---|
| | | | 0 | 1 | 2 | 3 | 4 | 5 | 6 | 7 | 8 | 9 | 10 | 11 | 12 | 13 | 14 | $I_3$ | $I_2$ | $I_1$ | $I_0$ |
| 32 | 1 | 1 | 1 | x | x | x | x | x | x | x | x | x | x | x | x | x | x | 0 | 0 | 0 | 0 |
| | | | 0 | x | x | x | 1 | x | x | x | x | x | x | x | x | x | x | 0 | 0 | 0 | 1 |
| | | | 0 | x | x | x | 0 | x | x | x | x | x | x | x | x | x | x | 0 | 0 | 1 | 0 |
| | | | 0 | x | x | x | 0 | x | x | x | 0 | x | x | x | x | x | x | 0 | 0 | 1 | 1 |
| 16 | 0 | 1 | 1 | 1 | x | x | x | x | x | x | x | x | x | x | x | x | x | 0 | 0 | 0 | 0 |
| | | | 1 | 0 | x | x | x | x | x | x | x | x | x | x | x | x | x | 0 | 0 | 0 | 1 |
| | | | 0 | x | x | x | 1 | 1 | x | x | x | x | x | x | x | x | x | 0 | 0 | 1 | 0 |
| | | | 0 | x | x | x | 1 | 0 | x | x | x | x | x | x | x | x | x | 0 | 0 | 1 | 1 |
| | | | 0 | x | x | x | 0 | x | x | x | 1 | 1 | x | x | x | x | x | 0 | 1 | 0 | 0 |
| | | | 0 | x | x | x | 0 | x | x | x | 1 | 0 | x | x | x | x | x | 0 | 1 | 0 | 1 |
| | | | 0 | x | x | x | 0 | x | x | x | 0 | 1 | x | x | x | x | x | 0 | 1 | 1 | 0 |
| | | | 0 | x | x | x | 0 | x | x | x | 0 | 0 | x | x | x | x | x | 0 | 1 | 1 | 1 |
| 8 | 0 | 0 | 1 | 1 | 1 | x | x | x | x | x | x | x | x | x | x | x | x | 0 | 0 | 0 | 0 |
| | | | 1 | 1 | 0 | x | x | x | x | x | x | x | x | x | x | x | x | 0 | 0 | 0 | 1 |
| | | | 1 | 0 | x | 1 | x | x | x | x | x | x | x | x | x | x | x | 0 | 0 | 1 | 0 |
| | | | 1 | 0 | x | 0 | x | x | x | x | x | x | x | x | x | x | x | 0 | 0 | 1 | 1 |
| | | | 0 | x | x | x | 1 | 1 | 1 | x | x | x | x | x | x | x | x | 0 | 1 | 0 | 0 |
| | | | 0 | x | x | x | 1 | 1 | 0 | x | x | x | x | x | x | x | x | 0 | 1 | 0 | 1 |
| | | | 0 | x | x | x | 1 | 0 | x | 1 | x | x | x | x | x | x | x | 0 | 1 | 1 | 0 |
| | | | 0 | x | x | x | 1 | 0 | x | 0 | x | x | x | x | x | x | x | 0 | 1 | 1 | 1 |
| | | | 0 | x | x | x | 0 | x | x | x | 1 | 1 | 1 | x | x | x | x | 1 | 0 | 0 | 0 |
| | | | 0 | x | x | x | 0 | x | x | x | 1 | 1 | 0 | x | x | x | x | 1 | 0 | 0 | 1 |
| | | | 0 | x | x | x | 0 | x | x | x | 1 | 0 | x | 1 | x | x | x | 1 | 0 | 1 | 0 |
| | | | 0 | x | x | x | 0 | x | x | x | 1 | 0 | x | 0 | x | x | x | 1 | 0 | 1 | 1 |
| | | | 0 | x | x | x | 0 | x | x | x | 0 | x | x | x | 1 | 1 | x | 1 | 1 | 0 | 0 |
| | | | 0 | x | x | x | 0 | x | x | x | 0 | x | x | x | 1 | 0 | x | 1 | 1 | 0 | 1 |
| | | | 0 | x | x | x | 0 | x | x | x | 0 | x | x | x | 0 | x | 1 | 1 | 1 | 1 | 0 |
| | | | 0 | x | x | x | 0 | x | x | x | 0 | x | x | x | 0 | x | 0 | 1 | 1 | 1 | 1 |

FIG. 4

CONTENT-ADDRESSABLE MEMORY WITH SOFT-MATCH CAPABILITY

BACKGROUND OF THE INVENTION

1. Field of the Invention

This invention relates generally to the field of associative memories and, more particularly, to content-addressable memories ("CAMs"), which can be used to compare an input data word with one or more stored keywords or references to determine whether the data word matches any of the keywords.

2. Discussion of the Prior Art

A content-addressable memory, or CAM, is a reprogrammable semiconductor memory device that can be used to compare a given data word, such as a record from a data base, with one or more key words or references to determine whether the data word matches any of the key words. In a conventional CAM, the desired keywords are first loaded into the CAM in a manner analogous to that in which information is written into a random-access memory. Subsequently, a data word applied to a CAM input port can be simultaneously compared to all of the key words stored in the CAM.

The comparison is typically performed by circuitry more or less integral with each key-word storage location itself. This circuitry operates to make the logical comparison between its associated key word and the data word. If the data word matches the key word (responder), the circuitry produces an output signal indicative of the match, and the CAM produces an output that identifies the CAM location in which the match exists.

In addition to being used to find exact matches, CAMs can be used to determine whether the incoming data word is close to a desired word, or alternately, whether any of the stored key words is close to a word of interest.

In the former case, the CAM contains not only the desired key word but also key words that are close to the desired key word. In that way, a match indicates that the data word is close to the desired word, and the address indicated by the CAM is an indication of the closeness if the computer using the CAM has separately stored the relationship between "closeness"—typically measured by Hamming distance—and memory location.

To determine whether any of the CAM contents are close to a desired word, on the other hand, one sequentially applies to the CAM as data words the desired word and all words within the acceptable Hamming distance.

SUMMARY OF THE INVENTION

The present invention is an improvement upon conventional content-addressable memories. Unlike conventional CAMs, it requires only a single location to determine whether the input data word is close to a desired word, and it requires only a single operation to determine whether any of its locations contains the word close to a desired word.

Associated with each word location is a distance circuit, which is responsive to the contents of that location and to a data input signal applied to the CAM, to determine the distance between the key word and the data word and to generate a distance output that represents the determined distance.

A comparison circuit receives the distance outputs from the distance circuits associated with all of the key word locations, compares the distances that they represent, and identifies the location whose contents represent the key word closest to the data word. The comparison circuit generates a signal that identifies that location as well as a signal representing the closeness of the data word of the closest key word. Such a circuit can identify inexact matches much more rapidly, or with much less memory capacity, than conventional content-addressable memories.

The invention is defined with more particularity in the accompanying claims.

BRIEF DESCRIPTION OF THE DRAWINGS

The above and further advantages of the invention may be better understood by referring to the following description in conjunction with the accompanying drawings, in which:

FIG. 4 is a truth table of the encoder employed in the embodiment of FIG. 3.

DETAILED DESCRIPTION OF ILLUSTRATIVE EMBODIMENTS

Figure 1:
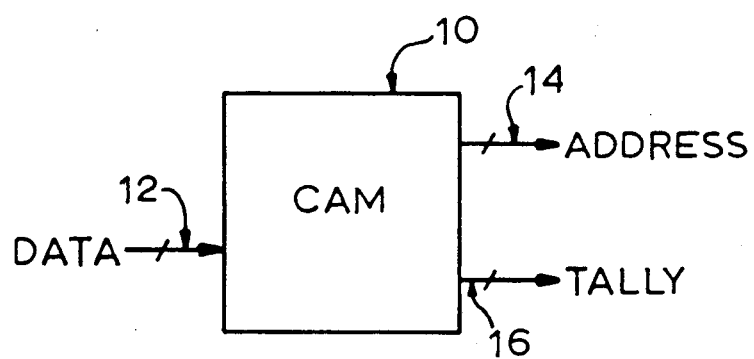
FIG. 1 is a simple block diagram depicting the signal flow into and out of the content-addressable memory of the present invention.

FIG. 1 is a simplified illustration of the overall operation of the closest-content-addressable memory of the present invention. Like most content-addressable memories, the closest-content-addressable memory 10 of the present invention receives a data word on DATA input lines 12. The memory 10 searches all of its memory locations simultaneously for a match with this input data word. In a typical prior-art content-addressable memory, the output of the CAM is an output word associated with the location, if any, that contains an exact match to the input data word. In other words, the prior-art content-addressable memory only produces an output when the input data word exactly matches a stored key word. Thus, in order to compare a single input data word to a number of slightly varying key words, each variation of the key word must be stored in a separate location as a separate keyword.

In most cases, the output word of the CAM is simply the address of the location in which the key word is stored that exactly matches the input data word. Typical content-addressable memories also include match lines (outputs), which indicate whether any match at all has been found. Since it is possible that more than one location contains a match, the content-addressable memory of necessity assigns some type of priority to the various locations so that the output is initially the address of the highest-priority location in which a match has been found. The content-addressable memory may also include some type of circuitry that the user can employ to read out the addresses of all of the match-containing locations sequentially.

The closest-content-addressable memory of the present invention differs from prior-art arrangements in that the ADDRESS output is not necessarily the address of a location containing an exact match. If no match occurs, the address lines 14 carry the address of the location whose key-word contents have the lowest Hamming distance from the data word on lines 12.

Although the illustrated embodiment employs Hamming distance as the "closeness" measurement, those skilled in the art will recognize that the principle of the present invention could also be employed with other measures of "closeness."

The closest-content-addressable memory 10 of the present invention also differs from typical prior-art content-addressable memories in that it provides a TALLY output on lines 16 instead of the match output commonly provided by prior-art arrangements. The TALLY signal represents the closeness of the key word closest to the data word. For instance, if the DATA input word is eight bits wide and the distance between the DATA input and the closest key word is three, the tally output would be five $(8-3=5)$.

Like the content-addressable memories of the prior art, the closest-content-addressable memory of the present invention employs a priority among its memory locations so that, in the event of a tie, the output on line 14 is the address of the highest-priority location having the lowest distance. As was mentioned above, some CAMs have provisions for sequentially producing signals representing the addresses of all the match-containing locations, and the closest-content-addressable memory of the present invention could be provided with such features too, but such features are not required and so will not be described in this specification.

Figure 2:
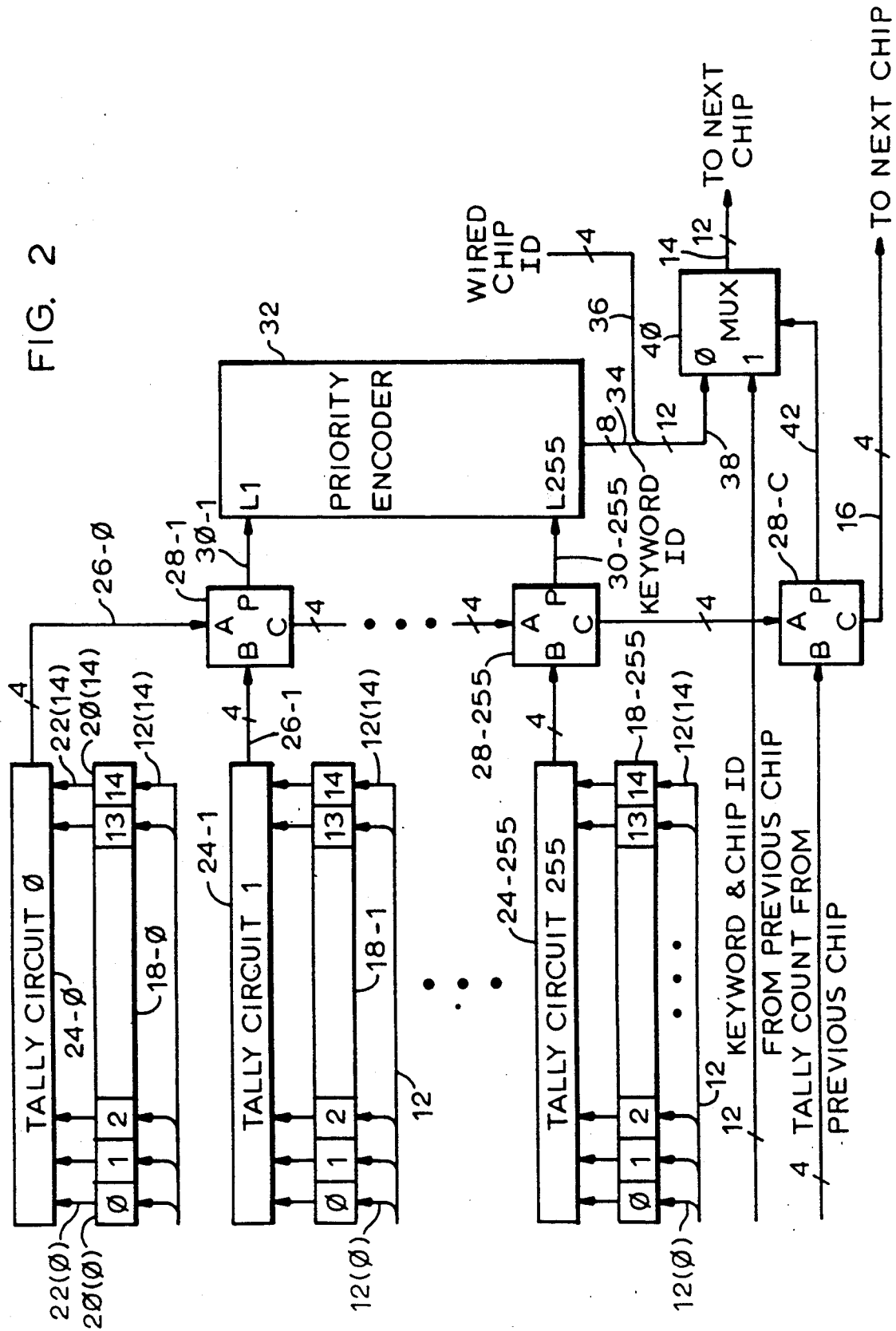
FIG. 2 is a block diagram of the circuitry on a single chip of the content-addressable memory of FIG. 1.

FIG. 2 depicts the circuitry located on one chip of a multi-chip closest-content-addressable memory such as memory 10 of FIG. 1. The circuitry includes a plurality of word locations 18-0 through 18-255. Each of the word locations 18-0 through 18-255 includes fifteen bit locations, such as bit locations 20(0) through 20(14) of word location 18-0, and each bit location includes a bit cell that contains one bit of a fifteen-bit word. It should be noted that the choice of fifteen as the width of the input data word, in the embodiment of FIG. 2, is arbitrary. The actual word-width required is dependent on the application and may be adjusted accordingly.

In most proposed CAM designs, the circuitry that provides each bit cell also provides, more or less integrally with the bit cell itself, part of the circuitry for performing the Hamming-distance determination. An example of such a bit cell is illustrated, for instance, in Hnateck, *A User's Handbook of Semiconductor Memories* (John Wiley and Sons, 1977), p. 599. This circuitry receives the signal on an associated one of the DATA lines 12(0) through 12(14). The result is a match output on a respective one of the bit-cell output lines 22(0)-22(14) indicating whether the contents of the associated bit cell 20 matches the corresponding bit in the data word on lines 12.

Also associated with each word location is a tally circuit 24, (i.e., one of the tally circuits 24-0 through 24-255), which receives all of the bit-cell output lines 22 from its associated word location and generates a four-bit output on an intermediate tally line 26. The signal on tally line 26 is the binary code for the number of bits in the data word that match the corresponding bits of the associated key word. The tally output is indicative of the Hamming distance, because the difference between the word length and the tally is the Hamming distance. The tally output can thus be thought of as a distance output.

The tally lines 26 feed respective ones of a cascade of comparison circuits 28-1 through 28-255. Comparison circuit 28-1 receives two inputs, an "A" input from tally lines 26-0 and a "B" input from tally lines 26-1. Each comparison circuit has two functions. The first is to forward as its "C" output the higher of the two values at its "A" and "B" input ports. The "C" output of one comparison circuit 28 is the "A" input of the next (lower-priority) comparison circuit. Consequently, each comparison circuit 28 generates as its "C" output the highest of the tallies of its associated memory location and all memory locations above it in FIG. 2. The "C" output of comparison circuit 28-255 is the tally of the key word closest to the data word on lines 12.

For multi-chip operation, a further comparison circuit 28-C is provided to receive the tally count from a previous, next-lowest-priority chip. The "C" output from comparison circuit 28-C may then be the TALLY signal on line 16 for the entire memory. In the alternative, it could be applied to a similar comparison circuit in a subsequent, higher-priority chip.

The other function of each of the comparison circuits 28-1 through 28-255 is to indicate whether the tally of its associated memory location is higher then the tally of any higher-priority location. This indication is produced at the "P" output port. The "P" output is a logic one if the "B" input is greater then the "A" input, and it is a logic zero otherwise. From the "P" outputs, priority encoder 32 generates the output word—in the illustrated embodiment, the address associated with the best-match location—by encoding into an eight-bit ID word on ID output lines 34 the position of the lowest-priority "P" line containing the logic one. This signal identifies the highest-priority memory location in the chip of FIG. 2 containing the contents closest to the key word on lines 12.

As was just mentioned, however, the chip of FIG. 2 may be one of, say, sixteen such chips in the memory 10. If so, the location ID lines 34 are joined by a four-bit chip ID signal on lines 36 so that the resulting twelve-bit signal identifies the location within the larger memory 10. This signal on lines 38 is fed to a multiplexer 40, whose other input is the output of a similar multiplexer on the previous chip. The select signal on line 42 is the "P" output of comparison circuit 28-C. The signal on line 42 indicates whether the highest tally from the previous chip is greater then the highest tally on the chip of FIG. 2. If so, it causes the multiplexer 40 to forward as its output the location and chip ID forwarded by the corresponding multiplexer in the previous chip. Otherwise, it forwards the location and chip ID from line 38 of the chip of FIG. 2. Thus, the priority of the chip of FIG. 2 is higher than that of the previous chip.

The output of multiplexer 40 is the ADDRESS signal on line 14 if the chip of FIG. 2 is the highest-priority chip. Otherwise, it is applied to one of the input ports of a corresponding multiplexer in a higher-priority chip.

As is apparent, the arrangement of FIG. 2 lends itself readily to employment in memories of various sizes. If the memory contains more than sixteen chips, the only adaptation required is that the chip ID and location-and-chip ID signals must consist of more bits.

Figure 3:
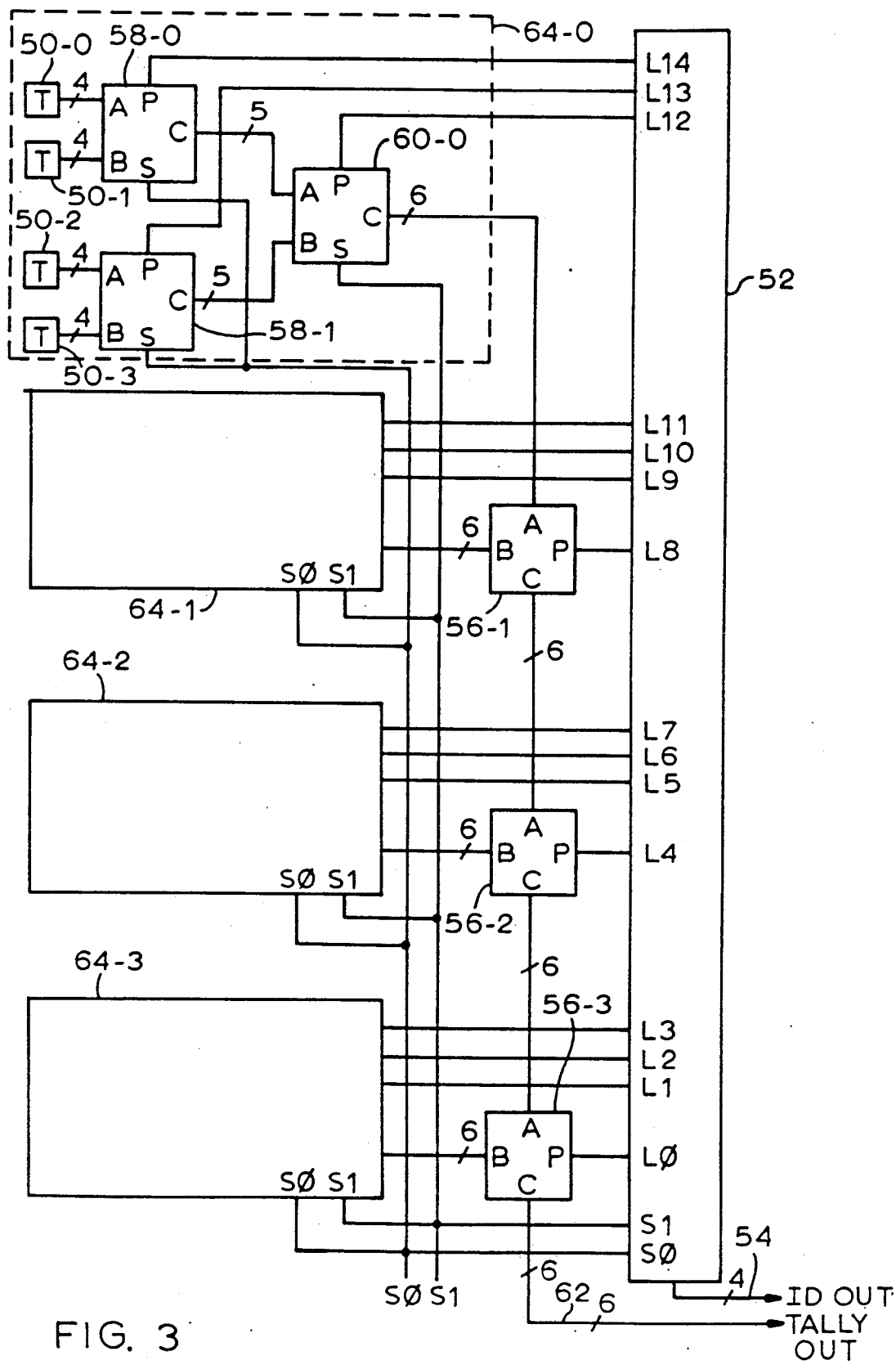
FIG. 3 diagram of the circuitry on a single chip of another embodiment of the present invention.

To add even further flexibility, one can employ the embodiment of FIG. 3. FIG. 3 performs an overall function largely similar to that of FIG. 2, but provides a variable key-word size. Omitted from FIG. 3 for the sake of simplicity are the word locations themselves, which are similar to those of FIG. 2 with the exception that each is eight bits wide rather than fifteen. The output of each memory location is applied to a corresponding tally circuit 50, which is similar to the tally circuit 24 of FIG. 3 with the exception that it, like the word locations, is only eight bits wide.

The outputs of the tally circuits 50 are processed by the circuitry of FIG. 3 to result in input signals at a priority encoder 52, which, like the encoder 32 of FIG. 2, determines from those outputs the location of the key word having the best match, and it places the address of this location on lines 54. The priority encoder 52 of FIG. 3 differs from the priority encoder 32 of FIG. 2 in that its output is only 4 bits wide because the memory unit depicted in FIG. 3 contains only sixteen eight-bit word locations, so only four bits are needed to specify the address of the winning word location. Comparison circuits 56 operate in a manner identical to that in which comparison circuits 28 of FIG. 2 operate with the exception that the tally inputs are six bits wide because of the possibility of a thirty-two-bit word width. Since the word width is thirty-two bits, there can be thirty-three tally values, zero through thirty-two, and it takes six bits to represent thirty-three different values.

The priority encoder 52 differs from that of FIG. 2 additionally in that it receives two select signals, S0 and S1, which together signify whether the circuit is to operate on eight-bit words, sixteen-bit words, or thirty-two-bit words. If S0 and S1 indicate that the circuit is to operate on thirty-two-bit words, there are only four thirty-two-bit locations in the circuit segment serviced by priority encoder 52, so the encoder "ignores" all of its inputs except for L0, L4, and L8, each of which indicates whether its associated thirty-two-bit word has a higher tally than any word in a higher-priority location.

Although the comparison circuits 56 of FIG. 3 operate in substantially the same manner as the comparison circuits 28 of FIG. 2 do, the origins of their tally inputs differ. Specifically, instead of being generated directly by the tally circuits 50, they are generated by a combination of hybrid comparison circuits 58 and 60. Circuits 58 and 60 can operate not only as comparison circuits in the normal manner but also in an adder mode, in which their "C" outputs are the sum of their tally inputs rather than the higher of the two. Signals S0 and S1 determine the modes in which hybrid comparison circuits 58 and 60, respectively, are to operate.

In the thirty-two-bit mode, the S0 and S1 signals indicate that the hybrid comparison circuits 58 and 60 are both to operate as adders rather then as comparison circuits. Hybrid comparison circuit 58-0 thus adds the tally outputs of tally circuits 50(0) and 50(1); that is, the "C" output of hybrid comparison circuit 58-0 is the total tally for the first sixteen bits of the thirty-two-bit word. Similarly, the "C" output of hybrid comparison circuit 58-1 is the total tally for the second sixteen bits of the thirty-two-bit word. Hybrid comparison circuit 60-0 receives these two sum signals and adds them to produce the total tally of the first thirty-two-bit word as its "C" output, which is the "A" input of comparison circuit 56-1.

The "B" input of chip 56-0 is the sum from a circuit 64-1, which is identical to circuit 64-0.

Circuits 56 operate in the normal manner, forwarding the higher of their "A" and "B" inputs in a cascade fashion so that the highest tally from the locations in the chip of FIG. 3 appears on output lines 62. In the thirty-two-bit mode, therefore, the circuit of FIG. 3 generates tally and location-ID signals analogous to those generated by the circuitry of FIG. 2. Additionally, these signals can be directed respectively to a chip comparator and multiplexer analogous to elements 28-C and 40 of FIG. 2 so that the arrangement of FIG. 3 can be cascaded with other chips of the same type. In short, the arrangement of FIG. 2 operates on thirty-two-bit words in the same manner as that in which the arrangement of FIG. 2 operates on fifteen-bit words.

To switch to a sixteen-bit mode, the state of S1 is changed, while that of S0 remains the same. Hybrid comparison circuits 58 still operate as adders, therefore, but hybrid comparison circuits 60 now operate in a manner identical to that in which comparison circuits 28 and 56 operate. Specifically, each comparison circuit 60 now produces as its "C" output the higher of its "A" and "B" inputs rather than their sum. The "C" output of comparison circuit 60-0 is thus the higher of the tallies of the two sixteen-bit words represented by tally circuits 50-0 through 50-3. Comparison circuit 56-0 compares this tally with the tally from a previous chip (or with zero if there is no previous chip) and applies the higher tally as its "C" output to the "A" input port of circuit 56-1. The result is not a pure cascade of comparisons, as it was in the thirty-two-bit mode. Instead, it is a cascade of one-level trees in which comparison circuits 60 perform the lower tier of comparisons while comparison circuits 56 perform the upper tier.

Despite the tree structure, the highest tally signal appears on lines 62 in the usual way. The tree structure necessitates a somewhat different determination of the identity of the best match location, however. Because the "B" input of each of the top-tier comparison circuits 56 in the sixteen-bit operation represents the higher of the tallies of two words rather than the tally of a single key word, its "P" output indicates that one of two words has a higher match than any higher-priority words but it does not tell which word that is. To determine which of those two words has the better match, therefore, it is necessary additionally to inspect the "P" output of one of the two hybrid circuits 60 from which the top-tier comparison circuit 56 receives its "A" and "B" tally inputs.

Accordingly, the encoder 52 does not simply encode the location of the lowest-priority logical-one input. Instead, it generates its output in accordance with the sixteen-bit-mode section of the truth table depicted in FIG. 4.

In the eight-bit mode, the tree structure has one more tier. The values of S0 and S1 are both zero to indicate the eight-bit mode, so hybrid comparison circuits 58 and 60 both operate as comparison circuits rather than as adders. The result is that each of the top-tier comparison circuits 56 receives as its "B" input the highest of the tallies of the four eight-bit words at the base of its "tree," while it receives as its "A" input the cascaded values from all higher-priority trees. This results in a tally value on line 62 equal to the highest of all of the tallies of the locations on the chip of FIG. 3.

Because of the tree organization, however, the "P" output of each of the top-tier comparison circuits 56 indicates only that one of the four locations in the "tree" with which that top-tier comparison circuit is associated has a match better than that of any of the locations in the higher-priority trees. It does not specify which of the four locations at the base of the tree has that best match. To identify which of the four it is, the priority encoder circuit 52 must consult the "P" outputs of the lower-level comparison circuits 58 and 60. This is reflected in the eight-bit-mode section of the truth table of FIG. 4.

It will be appreciated that the tree arrangement of FIG. 3 has the potential for operating more rapidly than the strictly cascade arrangement of FIG. 2. For this reason, it may be desirable to employ a tree arrangement, despite the extra hardware requirement, even in systems in which the ability to vary word size is not needed. In such arrangements, the lower-level comparison circuits such as circuits 58 and 60 could be like the top-tier circuits 56 in that they would be dedicated to the comparison function and would not additionally require an adder option.

It is apparent from the foregoing description that the teachings of the present invention provide a significant advance in the art. Since the closest-content-addressable memory performs "soft" matches and not just exact matches, a single memory location can be employed in situations in which multiple locations with different "close"0 values would be needed for an exact-match content-addressable memory. Furthermore, the hardware soft-match operation permits a "soft match" to be identified in a single step, while exact-match arrangements would require many steps to achieve the same result. The closest-content-addressable memory of the present invention thus constitutes a significant advance in the art.

What is claimed as new and desired to be secured by Letters Patent of the United States is:

1. For containing key words, receiving a data-word signal representing a data word, comparing the data word with the key words, and generating a memory output representative of the results, a content-addressable memory comprising:
   A. word-location means forming a plurality of word locations, each word location having contents representing one of the key words and having an output word associated therewith;
   B. a distance circuit associated with each word location, all distance circuits being simultaneously responsive to the data signal and the key words represented by the contents of their associated word locations to determine the distances between their respective key words and the data word represented by the data signal and to generate respective distance outputs representative of the determined distances; and
   C. comparison means for receiving the distance signals from all of the distance circuits, comparing the distances represented thereby, identifying the word location whose contents represent the key word closest to the data word, and generating as the memory output a signal representing the output word associated with the identified word location.

2. A content-addressable memory as defined in claim 1 wherein the output word associated with each memory location is a unique address associated therewith.

3. A content-addressable memory as defined in claim 1 wherein the distance determined by the distance circuit is the Hamming distance.

4. A content-addressable memory as defined in claim 1 wherein the comparison means further includes means for generating a highest-tally output indicative of the distance from the data word of the key word having the lowest distance therefrom.

5. A content-addressable memory as defined in claim 1 wherein:
   A. each key word comprises a plurality of bits;
   B. each word location comprises a plurality of bit cells, each of which contains one bit of the key word contained in the word location of which it is a part;
   C. each distance circuit includes match means associated with each bit cell of the word location with which that distance circuit is associated, each match means receiving a bit of the data signal, comparing it with the bit cell with which that match means is associated, and generating a match signal indicative of whether the received data-word bit and the contained key-word bit are the same; and
   D. each distance circuit further includes a tally circuit for receiving the match signals from all of the match means associated with the bit cells of the word location with which that distance circuit is associated and for generating as the distance output an indication of the total of the matches represented by the match signals that it receives.

6. A content-addressable memory as defined in claim 1 wherein the comparison means comprises:
   A. a plurality of comparison circuits organized in a cascade arrangement, each comparison circuit in the cascade arrangement being associated with at least one distance circuit, receiving as a first input a signal indicative of the lowest distance indicated by a distance circuit with which it is associated, receiving as a second input a signal representing another distance, and generating a comparison output that indicates whether its first input indicates a lower distance than its second input; and
   B. an encoder circuit for receiving the comparison output and generating the memory output in response thereto.

7. A control-addressable memory as defined in claim 1 wherein the memory is operable in first and second modes and wherein:
   A. each word location comprises a plurality of component word locations, each of which contains a component key word consisting of a subset of the bits of the key word contained by the word location of which that component key word is a part;
   B. each distance circuit associated with a word location includes a component distance circuit associated with each component word location of that word location, each component distance circuit being responsive to a respective component data word consisting of a subset of the bits of the data word represented by the data signal and to the component key word contained in its associated component word location to determine the distance between the component key word and its respective component data word and to generate a component distance output representative of that distance; and
   C. each distance circuit further includes an addition/-comparison circuit that receives the component distance outputs from the component distance circuits in that distance circuit and generates as the distance output thereof a signal that represents (i) the sum of the distances represented by the component distance outputs when the memory is in the first mode and (ii) the lowest of the distances represented by the component distance outputs when the memory is in the second mode.

8. A content-addressable memory as defined in claim 1 wherein:

A. the word location in the word-location means are organized into a plurality of memory sections;
B. the comparison means includes a comparison section associated with each memory section for receiving the distance signals from all of the distance circuits associated with the word locations in its associated memory section, comparing the distances represented thereby, identifying the word location whose contents represent the key word closest to the data word, generating a section distance output representing the distance of that closest key word from the data word, and generating as a section memory output the output word associated with the identified word location; and
C. the comparison means further includes a composite comparison circuit for receiving the section distance and memory outputs, comparing the distances represented thereby, identifying the comparison section from which is receives the section distance output representing the smallest distance, and forwarding as the memory output the section memory output that it receives from the identified comparison section.

* * * * *